(12) United States Patent
Yoshimura et al.

(10) Patent No.: US 12,347,698 B2
(45) Date of Patent: Jul. 1, 2025

(54) LIQUID PROCESSING APPARATUS AND LIQUID PROCESSING METHOD

(71) Applicant: TOKYO ELECTRON LIMITED, Tokyo (JP)

(72) Inventors: Koki Yoshimura, Kumamoto (JP); Satoshi Nakakido, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/228,905

(22) Filed: Aug. 1, 2023

(65) Prior Publication Data

US 2024/0047237 A1 Feb. 8, 2024

(30) Foreign Application Priority Data

Aug. 8, 2022 (JP) .................. 2022-126419

(51) Int. Cl.
*H01L 21/67* (2006.01)
*H01L 21/02* (2006.01)
*H01L 21/687* (2006.01)

(52) U.S. Cl.
CPC .... *H01L 21/67051* (2013.01); *H01L 21/6715* (2013.01); *H01L 21/68764* (2013.01); *H01L 21/02307* (2013.01); *H01L 21/67017* (2013.01); *H01L 21/67023* (2013.01); *H01L 21/6719* (2013.01)

(58) Field of Classification Search
CPC .......... H01L 21/02041–02093; H01L 21/67017–67086; H01L 21/00–86
See application file for complete search history.

(56) References Cited

U.S. PATENT DOCUMENTS

2011/0297192 A1 * 12/2011 Ogata ............... H01L 21/67051
134/94.1
2013/0008872 A1 * 1/2013 Higashuima ........ H01L 21/6715
156/345.23

FOREIGN PATENT DOCUMENTS

JP 2018-18854 A 2/2018

* cited by examiner

*Primary Examiner* — Eric W Golightly
*Assistant Examiner* — Richard Z. Zhang
(74) *Attorney, Agent, or Firm* — Nath, Goldberg & Meyer; Jerald L. Meyer; Tanya E. Harkins

(57) ABSTRACT

A liquid processing apparatus includes: a stage; a cup that surrounds a substrate placed on the stage; a processing liquid supplier that supplies a processing liquid to the substrate; an exhaust port provided in the cup to exhaust the cup; an annular body provided inside the cup to surround the substrate and form a flow path for a gas flowing into the cup; a lifting mechanism that raises or lowers the annular body relative to the cup to perform a switching between a first state in which the annular body is located at a first relative height to perform a first exhaust and a second state in which the annular body is located at a second relative height to perform a second exhaust; and a drainage port that opens to an upstream side of the exhaust port in each of the first and second flow paths.

7 Claims, 5 Drawing Sheets

LIQUID PROCESSING APPARATUS AND LIQUID PROCESSING METHOD

CROSS-REFERENCE TO RELATED APPLICATION

This application is based upon and claims the benefit of priority from Japanese Patent Application No. 2022-126419, filed on Aug. 8, 2022, the entire contents of which are incorporated herein by reference.

TECHNICAL FIELD

The present disclosure relates to a liquid processing apparatus and a liquid processing apparatus.

BACKGROUND

In a semiconductor device manufacturing process, processing is performed by supplying various processing liquids to a semiconductor wafer (hereinafter, referred to as a "wafer"). Patent Document 1 discloses a developing apparatus in which a wafer is accommodated in a cup (outer cup) and a developer selected from a first developer (positive tone developer) and a second developer (negative tone developer) is applied to the wafer, so that processing is performed. In the developing apparatus, a first-developer exhaust port, a first-developer drainage port, a second-developer exhaust port, and a second-developer drainage port are arranged in an outer cup at positions different from each other in a radial direction. Since a height of an annular body (inner cup) provided inside the outer cup changes depending on a developer to be used, exhaust and drainage flow paths in the outer cup change.

PRIOR ART DOCUMENTS

Patent Documents

Patent Document 1: Japanese Patent Laid-Open Publication No. 2018-018854

SUMMARY

According to one embodiment of the present disclosure, there is provided a liquid processing apparatus including: a stage on which a substrate is placed; a cup configured to surround the substrate placed on the stage; a processing liquid supplier configured to supply a processing liquid to the substrate to perform processing; an exhaust port provided in a bottom portion of the cup to exhaust an interior of the cup; an annular body provided inside the cup to surround the substrate in a plan view and configured to form a flow path for a gas flowing into the cup from an opening of the cup; a lifting mechanism configured to raise or lower the annular body relative to the cup to perform a switching between a first state in which the annular body is located at a first relative height and a first exhaust is performed through a first flow path that allows the gas to flow from a central side of the cup into the exhaust port and a second state in which the annular body is located at a second relative height and a second exhaust is performed through a second flow path that allows the gas to flow from an outer-peripheral-side of the cup into the exhaust port; and a drainage port which is open to an upstream side of the exhaust port in each of the first flow path and the second flow path.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
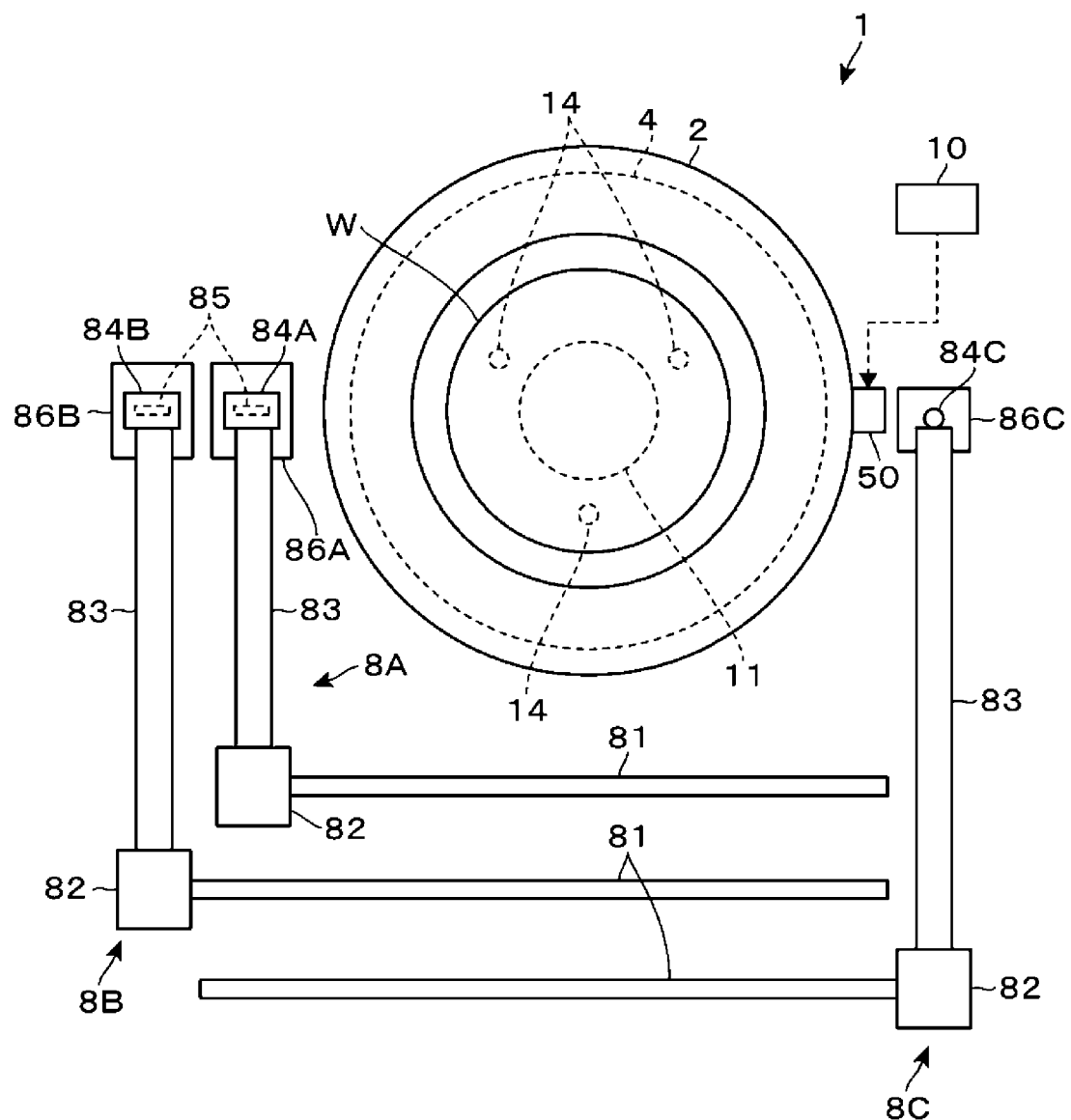
FIG. 1 is a plan view of a developing apparatus according to an embodiment of the present disclosure.

A developing apparatus 1 according to an embodiment of a liquid processing apparatus of the present disclosure will be described with reference to a plan view of FIG. 1. A wafer W, which is a circular substrate, is transferred to the developing apparatus 1 by a transfer mechanism (not illustrated). An exposed resist film is formed on the surface of the wafer W along a predetermined pattern. The resist film is made of a positive or negative resist. Depending on the resist film formed on the wafer W, the developing apparatus 1 applies a positive resist developer (positive developer) D1 or a negative resist developer (negative developer) D2 to the wafer W to perform a development processing. In the developing apparatus 1, a cleaning processing is also performed by supplying a cleaning liquid to the surface of the wafer W after the development processing. Therefore, the developer (the positive developer D1 or the negative developer D2) and the cleaning liquid are processing liquids for processing the wafer W.

The developing apparatus 1 includes a spin chuck 11, a cup 2, a lifting mechanism 50, an annular body 4, a positive-developer processing mechanism 8A, a negative-developer processing mechanism 8B, and a cleaning-liquid processing mechanism 8C. In a state in which the wafer W transferred from a rear side of the cup 2 by a transfer mechanism (not illustrated) is accommodated in the cup 2 and placed on the spin chuck 11, which is a stage, the above-mentioned development processing and cleaning processing are performed. An exhaust port 20 is formed inside the cup 2, and a gas forming atmosphere around the cup 2 flows into the cup 2 from an opening of the cup 2 and is exhausted from the exhaust port 20, so that mist generated during processing is prevented from leaking out of the cup 2.

The annular body 4 is provided inside the cup 2, and is raised and lowered between an upper position (first relative height) and a lower position (second relative height) inside the cup 2 by the lifting mechanism 50, so that the cup's role is to switch a flow path (exhaust path) used inside the cup 2 between a first flow path 21 and a second flow path 22. This switching is performed by narrowing one of the first flow path 21 and the second flow path 22 to increase a pressure loss and expanding the other to decrease the pressure loss, and the exhaust amount of the narrowed flow path becomes zero or very small. The annular body 4 is located at the upper position inside the cup 2 during processing with the positive developer D1, and is located at the lower position inside the cup 2 during processing with the negative developer D2. The narrowing of a flow path includes not only a width reduction of the flow path but also a closing of the flow path. The narrowing of the flow path may be performed in a state in which the annular body 4 is not in contact with another wall surface (a bottom wall 35) or may be performed in a state in which the annular body 4 is in contact another wall surface. When the flow path is narrowed in the non-contact state, it is possible to suppress destabilization of an exhaust pressure due to wear or damage of members.

A downstream end of the first flow path 21 and a downstream end of the second flow path 22 are configured with the above-described exhaust port 20. Therefore, the exhaust port 20 is common to the first flow path 21 and the second flow path 22, and is configured as the downstream end of these flow paths. In the first flow path 21 and the second flow path 22, a first drainage port 23 and a second drainage port 24 open respectively on an upstream side of the position where the exhaust port 20 is formed. In order to meet the requirement of separating and draining the positive developer D1 and the negative developer D2, which have different properties, the cup 2 is configured such that the positive developer D1 and the negative developer D2 flow through the first flow path 21 and the second flow path 22, respectively, flow into the first drainage port 23 and the second drainage port 24, respectively, and are removed. Configurations of the above-described cup 2 and annular body 4 will be described in detail later.

Next, a configuration of the positive-developer processing mechanism 8A will be described. The positive-developer processing mechanism 8A includes a guide rail 81, a moving mechanism 82, an arm 83, and a positive-developer nozzle 84A. The guide rail 81 is provided on a front side with respect to the cup 2 to extend in a left-right direction. The moving mechanism 82 is connected to the guide rail 81. The moving mechanism 82 is movable left and right along the guide rail 81. The arm 83 extends rearward from the moving mechanism 82. The arm 83 can be raised and lowered by the moving mechanism 82.

The positive-developer nozzle 84A is provided on a tip side of the arm 83. A slit extending left and right opens as an ejection port 85 at a lower end portion of the positive-developer nozzle 84A. The positive-developer nozzle 84A is connected to a positive-developer supply mechanism (not illustrated). The positive developer D1 supplied from the supply mechanism is ejected downward from the ejection port 85. The positive-developer nozzle 84A is moved by the moving mechanism 82 between a standby area 86A where the positive-developer nozzle 84A stands by outside the cup 2 and the wafer W placed on the spin chuck 11, and ejects the positive developer D1 onto the wafer W.

The negative-developer processing mechanism 8B has the same configuration as the positive-developer processing mechanism 8A except that the negative-developer processing mechanism 8B is connected to a supply mechanism (not illustrated) for the negative developer D2 and ejects the negative developer D2. A developer nozzle provided in the negative-developer processing mechanism 8B is illustrated as a negative-developer nozzle 84B.

The cleaning-liquid processing mechanism 8C has the same configuration as the positive-developer processing mechanism 8A except that the cleaning-liquid processing mechanism 8C includes a cleaning-liquid nozzle 84C instead of the positive-developer nozzle 84A, and an ejection port (not illustrated), which is a relatively small circular hole, is formed at a lower end of the cleaning-liquid nozzle 84C. The cleaning-liquid nozzle 84C is connected to a supply mechanism for a cleaning liquid (not illustrated), such as pure water. The cleaning liquid supplied from the supply mechanism is ejected downward from the ejection port of the cleaning-liquid nozzle 84C. The negative-developer nozzle 84B and the cleaning-liquid nozzle 84C are also movable between standby areas 86B and 86C provided outside the cup 2 and the wafer W placed on the spin chuck 11 and eject the negative developer D2 and the cleaning liquid onto the wafer W, respectively. In the following description, the positive-developer nozzle 84A, the negative-developer nozzle 84B and the cleaning-liquid nozzle 84C may be collectively referred to as a nozzle 84. The nozzle 84 corresponds to the processing liquid supplier in the appending claims.

Figure 2:
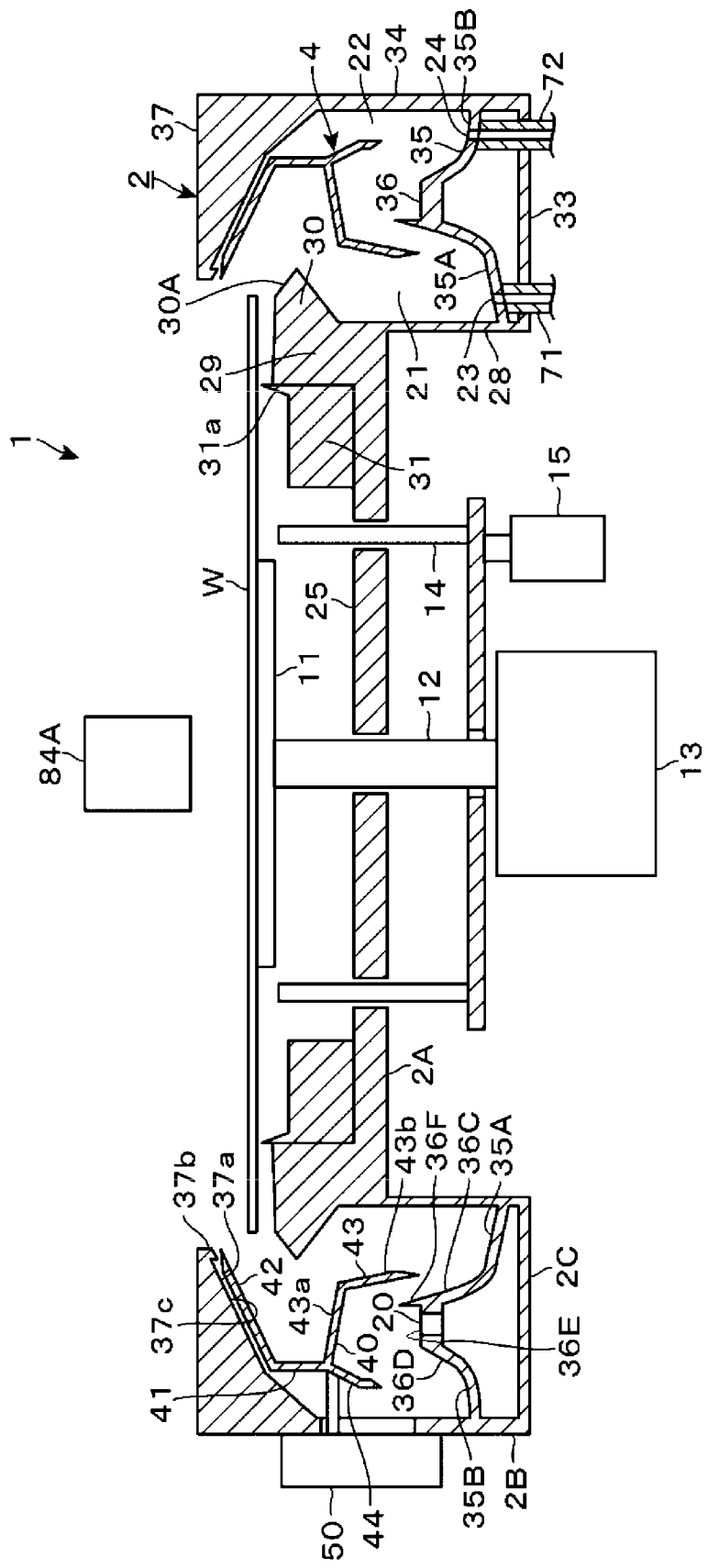
FIG. 2 is a cross-sectional view of the developing apparatus.
Figure 3:
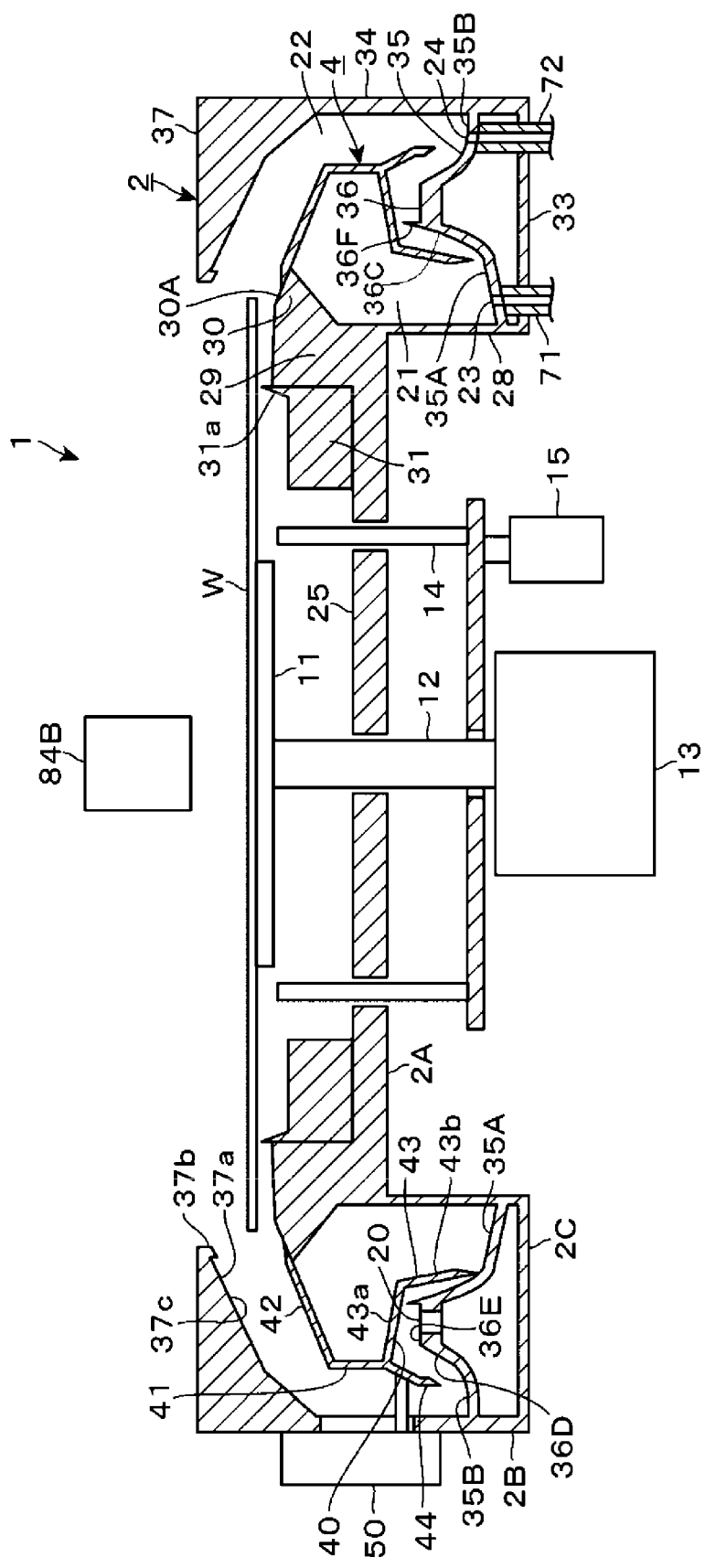
FIG. 3 is a cross-sectional view of the developing apparatus.
Figure 4:
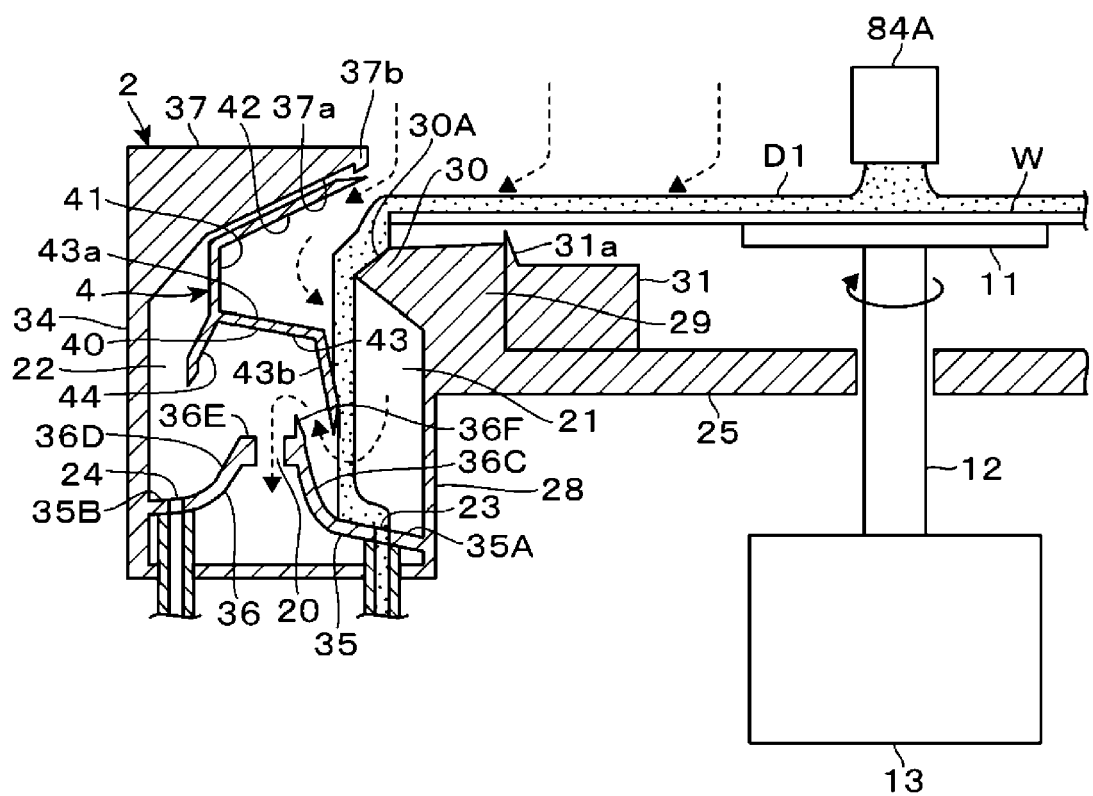
FIG. 4 is a vertical cross-sectional view of the developing apparatus, which illustrates processing with a positive developer.
Figure 5:
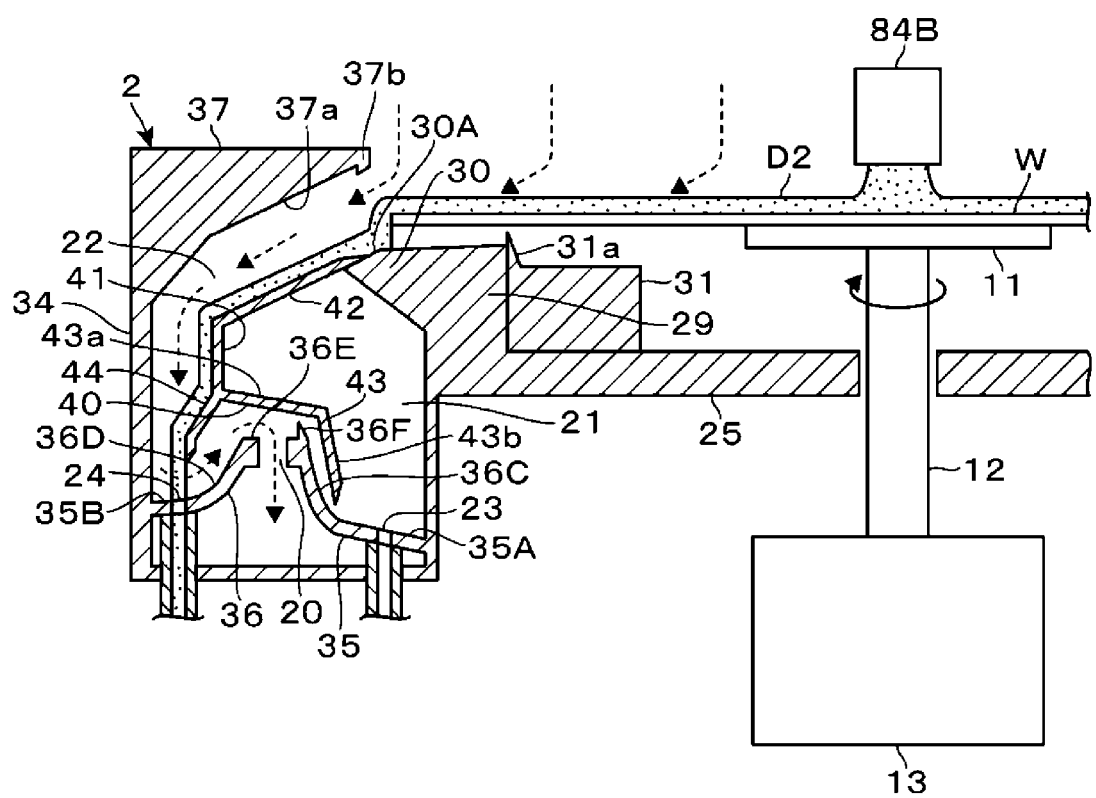
FIG. 5 is a vertical cross-sectional view of the developing apparatus, which illustrates processing with a negative developer.

Next, a description will be given with reference to FIGS. 2 to 5. FIGS. 2 to 5 are vertical cross-sectional views of the annular body 4 and the cup 2. FIGS. 2 and 4 illustrate the annular body 4 located at the upper position, and FIGS. 3 and 5 illustrate the annular body 4 located at the lower position. FIGS. 4 and 5 illustrate a state during development processing with the positive developer D1 and a state during development processing with the negative developer D2, respectively, wherein a gas flow flowing from the exterior of the cup 2 to the exhaust port 20 inside the cup 2 is indicated by dotted arrows. In order to illustrate the liquid flow of the positive developer D1 and the liquid flow of the negative developer D2 directed to the first drainage port 23 and the second drainage port 24 together with the above-described gas flow, FIGS. 4 and 5 illustrate the first drainage port 23 and the second drainage port 24 at different positions from the positions illustrated in FIGS. 2 and 3 in a circumferential direction of the cup 2.

As described above, the spin chuck 11 is provided inside the cup 2. The spin chuck 11 holds the wafer W horizontally by vacuum-attracting a central portion of a bottom surface of the wafer W. The spin chuck 11 is provided on a shaft 12 extending in a vertical direction (perpendicular direction). A lower side of the shaft 12 is connected to a rotary mechanism 13. The spin chuck 11 is rotated by the rotary mechanism 13 via the shaft 12, and the wafer W attracted thereto rotates around a vertical axis.

Three pins 14 (of which only two pins are illustrated in FIGS. 2 to 5) that supports the wafer W are provided to surround the spin chuck 11 in a plan view and are configured to be raised and lowered by a lifting mechanism 15. The wafer W is delivered between a transfer mechanism for the wafer W and the spin chuck 11 by raising and lowering the pins 14.

Next, the cup 2 will be described. The cup 2 is circular in shape. A central axis of the cup 2 coincides with a rotation axis of the spin chuck 11. Hereinafter, a direction oriented to the central axis of the cup 2 when viewed from above is referred to as a "central direction", and a direction opposite the central direction is referred to as an "outer peripheral direction", which may be collectively referred to as a "radial direction". The cup 2 includes a horizontal circular ring-shaped plate 25 located below the spin chuck 11 and provided to surround the shaft 12. The pins 14 are provided to pass through the circular ring-shaped plate 25.

A lower side of a peripheral portion of the circular ring-shaped plate 25 forms a vertical wall 28 extending perpendicularly downward (vertically downward). An upper side of the peripheral portion of the circular ring-shaped plate 25 is raised perpendicularly upward (vertically upward) to form a raised portion 29. The raised portion 29 projects in the outer peripheral direction to form a flange 30 located outside the vertical wall 28. The flange 30 has a shape that is tapered toward the outer periphery in a vertical cross-sectional view, so that a downward slope is formed from an inner edge of the raised portion 29 to an outer peripheral edge of an upper surface of the flange 30, and the flange 30 guides liquid adhering to the flange 30 to the bottom of the cup 2. This inclined surface becomes steeper at the flange 30 on the way down, and a portion with the steep inclination is illustrated as an inclined surface 30A.

A circular ring-shaped member 31 is provided inside the flange 30 along an inner surface of the raised portion 29. An upwardly-protruding circular ring-shaped sealing projection 31*a* is provided on a peripheral edge of an upper surface of the circular ring-shaped member 31. A distance between the sealing projection 31*a* and the wafer W is slightly smaller than a distance between the flange 30 and the wafer. The circular ring-shaped member 31 is adjustable in height with respect to the circular ring-shaped plate 25, so that the distance of the sealing projection 31*a* from the bottom surface of the wafer W is adjustable. The sealing projection 31*a* blocks mist that moves toward the center of the wafer W on the bottom surface of the wafer W, or blocks the liquid that turns around from the upper surface of the wafer W and moves toward the center of the wafer W. This prevents a problem from occurring in each process after the processing in the developing apparatus 1.

The cup 2 includes a horizontal annular wall 33 extending in the outer peripheral direction from a lower end portion of the vertical wall 28, a sidewall 34 extending upward from the outer peripheral edge of the annular wall 33 to have a cylindrical shape and constituting the outer surface of the cup 2, and a bottom wall 35 as an annular wall provided above the annular wall 33 and connecting the sidewall 34 and the vertical wall 28. A central portion of the bottom wall 35 in a width direction rises up to form an annular protrusion 36 that is tapered upward in a vertical cross-sectional view. In the bottom wall 35, portions provided inside and outside the annular protrusion 36 will be referred to as an inner base wall 35A and an outer base wall 35B, respectively. Hereinafter, these inner base wall 35A and outer base wall 35B may be collectively referred to as base walls 35A and 35B, respectively.

The base walls 35A and 35B are gently inclined upward toward the annular protrusion 36 in the radial direction. The inner base wall 35A is provided with a plurality of first drainage ports 23 arranged at intervals in the circumferential direction of the cup 2, and the outer base wall 35B is provided with a plurality of second drainage ports 24 arranged at intervals in the circumferential direction of the cup 2. The liquids flowing through the first drainage ports 23 and the second drainage ports 24 are discharged out of the cup 2 respectively through drainage path forming members 71 and 72 connected to the bottom wall 35.

Regarding the bottom wall 35, assuming that a portion forming an inner surface of the annular protrusion 36 and a portion forming an outer surface of the annular protrusion 36 are respectively an inner inclined wall 36C and an outer inclined wall 36D, slopes of the inner inclined wall 36C and the outer inclined wall 36D are steeper than those of the base walls 35A and 35B. A horizontal surface 36E is provided at an upper end of the annular protrusion 36. A narrowing projection 36F is provided on an inner peripheral edge of the horizontal surface 36E to protrude upward along the inner peripheral edge. The inner surface of the narrowing projection 36F is continuous with a side surface (inclined surface) formed by the inner inclined wall 36C.

On the outer-peripheral-side of the narrowing projection 36F on the horizontal surface 36E of the annular protrusion 36, a plurality of exhaust ports 20 are provided at intervals in the circumferential direction and open upward. Since a space between the bottom wall 35 and the annular wall 33 is connected to the plurality of exhaust ports 20 and is connected to an exhaust path (not illustrated) of a factory to have a negative pressure, the interior of the cup 2 is exhausted to the exhaust path of the factory via the exhaust ports 20. In addition, in FIGS. 2 and 3, the exhaust ports 20 are illustrated on the same plane as the first drainage ports 23 and the second drainage ports 24, but are not limited to being arranged along the diameter of the cup 2 in a plan view.

An annular upper wall 37 extending toward the center side is provided on the sidewall 34, and an inner peripheral edge of the upper wall 37 is located on the inclined surface 30A of the flange 30. A region surrounded by the inner peripheral edge of the upper wall 37 forms an opening of the cup 2. The wafer W is delivered to the spin chuck 11 via the opening. The upper wall 37 corresponds to a covering portion in the claims. The upper wall 37 surrounds the peripheral edge of the wafer W on the spin chuck 11 with a gap therebetween.

A bottom surface of the upper wall 37 is configured as a narrowing inclined surface 37*a* that rises toward the center side. An upper end of the narrowing inclined surface 37*a* protrudes downward to form an annular downward projection 37*b*. The annular downward projection 37*b* constitutes an inner peripheral edge of the upper wall 37. In other words, the upper wall 37 is provided with an annular concave portion 37*c* depressed upward in the lower portion thereof. The narrowing inclined surface 37*a* corresponds to a bottom surface of the concave portion 37*c*.

The above-described cup 2 is provided with: a central-side structure 2A including the circular ring-shaped plate 25, the vertical wall 28, and the flange 30, an outer-periphery-side structure 2B including the sidewall 34 and the upper wall 37; and a bottom-side structure 2C including the bottom wall 35 and the annular wall 33 and connecting the central-side structure 2A and the outer-periphery-side structure 2B. The cup 2 has a space surrounded by the central-side structure 2A, the outer-periphery-side structure 2B, and the bottom-side structure 2C.

Next, the annular body 4 will be described. The central axis of the annular body 4 is the same as the rotation axis of the spin chuck 11. In addition, the annular body 4 is provided in the space surrounded by the central-side structure 2A, the outer-periphery-side structure 2B, and the bottom-side structure 2C of the cup 2, and is provided around the wafer W with a gap therebetween when viewed from above. The annular body 4 includes a vertically-extending cylindrical vertical wall 41, an upper inclined wall 42 extending upward and inward from the upper end of the vertical wall 41, and an inner inclined wall 43 and an outer inclined wall 44 which are extension portions branched inward-downward and outward-downward from the lower end of the vertical wall 41. Each of the upper inclined wall 42, the inner inclined wall 43, and the outer inclined wall 44 has a cylindrical shape. The upper inclined wall 42 corresponds to a barrel portion.

An outer peripheral surface of the upper inclined wall 42 is parallel to the narrowing inclined surface 37a of the upper wall 37 in a vertical cross-sectional view. As will be described in detail later, when the annular body 4 is located at the upper position, the annular body 4 approaches the narrowing inclined surface 37a of the upper wall 37. Describing the upper inclined wall 42 in more detail, the upper end portion of the upper inclined wall 42 has a sharp point in a vertical cross-sectional view because its thickness decreases toward the upper side. In addition, the outer peripheral surface of the upper end portion is formed to be gentler in inclination than the outer peripheral surface of the lower side of the upper end portion. With the configuration described above, when the narrowing inclined surface 37a and the upper inclined wall 42 approach each other as described above, the lower end of the annular downward projection 37b and the upper end of the upper inclined wall 42 also approach each other, so that the narrowed portion of the second flow path 22 is long and is configured to sufficiently increase a pressure loss.

The inner inclined wall 43 of the annular body 4 is bent such that the tip side is steeper than the base end side. The base end side and the tip side are illustrated as a base-end-side inclined portion 43a and the tip-side inclined portion 43b, respectively. The tip-side inclined portion 43b is provided in parallel to the inner inclined wall 36C forming the annular protrusion 36. A thickness of a tip portion of the tip-side inclined portion 43b gradually decreases toward the tip thereof so that the tip is sharpened in a vertical cross-sectional view. This prevents a decrease in pressure loss when the first flow path 21 is expanded.

As in the inner inclined wall 43, the tip side of the outer inclined wall 44 is steeper in inclination than the base end side by being bent with respect to the base end side. In addition, a thickness of a tip portion of the outer inclined wall 44 gradually decreases toward the tip thereof so that the tip is sharped in a vertical cross-sectional view. This prevents a decrease in pressure loss when the second flow path 22 is expanded. In addition, the tip (lower end) of the outer inclined wall 44 is located above the tip (lower end) of the inner inclined wall 43. Furthermore, a portion of the outer peripheral surface of the outer inclined wall 44 is connected to the lifting mechanism 50 provided outside the cup 2 via a support member.

A positional relationship between the cup 2 and the annular body 4 will be described. The upper inclined wall 42 of the annular body 4 is provided below the upper wall 37 of the cup 2, more specifically, in a region immediately below the upper inclined wall 42. The inner peripheral edge of the upper inclined wall 42 and the inner peripheral edge of the upper wall 37 are aligned with each other in a plan view, so that the annular downward projection 37b and the upper inclined wall 42 can be brought close to each other, as described above. The outer surface of the vertical wall 41 of the annular body 4 and the inner surface of the sidewall 34 of the cup 2 are spaced apart from each other and face each other in the radial direction of the cup 2.

The inner inclined wall 43 and the outer inclined wall 44 of the annular body 4 are provided in a space surrounded by the vertical wall 28, the flange 30, the sidewall 34, and the bottom wall 35 of the cup 2. The base-end-side inclined portion 43a of the inner inclined wall 43 of the annular body 4 is provided above the annular protrusion 36 of the bottom wall 35, that is, in a region immediately above the annular protrusion 36. An opposite inclined surface 40, which is the bottom surface of the base-end-side inclined portion 43a, faces the exhaust ports 20. The lower end of the inner inclined wall 43 of the annular body 4 is located closer to the center than the horizontal surface 36E constituting the top of the annular protrusion 36. The lower end of the outer inclined wall 44 of the annular body 4 is located closer to the outer periphery than the horizontal surface 36E. In addition, each of the lower end of the inner inclined wall 43 and the lower end of the outer inclined wall 44 is floating from the bottom wall 35.

Specifically, the first flow path 21 and the second flow path 22 described above are annular flow paths with the opening of the cup 2 as a base end. The first flow path 21 is a flow path formed between the inner side of the annular body 4 and the cup 2, specifically between the central-side structure 2A and the bottom-side structure 2C of the cup 2 and the annular body 4. More specifically, the first flow path 21 is formed between the upper inclined wall 42, the vertical wall 41, the inner inclined wall 43 of the annular body 4, and the flange 30, the vertical wall 28, the inner base wall 35A, and the annular protrusion 36 of the cup 2. Herein, individual portions of the annular body 4 and individual portions of the cup 2 listed here form the first flow path 21 in those orders, respectively, from the upstream to the downstream.

The second flow path 22 is a flow path formed between the outer side of the annular body 4 and the cup 2, specifically between the outer-periphery-side structure 2B and the bottom-side structure 2C of the cup 2 and the annular body 4. More specifically, the second flow path 22 is formed between the upper inclined wall 42, the vertical wall 41, the outer inclined wall 44, the base-end-side inclined portion 43a of the inner inclined wall 43 of the annular body 4 and the upper wall 37, the sidewall 34, the outer base wall 35B, and the annular protrusion 36 of the cup 2. Herein, individual portions of the annular body 4 and individual portions of the cup 2 listed here form the second flow path 22 in those orders, respectively, from the upstream to the downstream. In addition, the downstream sides of the first flow path 21 and the second flow path 22 are formed on the lower side of the annular body 4, more specifically, between the base-end-side inclined portion 43a of the inner inclined wall 43 of the annular body 4 and the bottom-side structure 2C of the cup 2.

Therefore, the first flow path 21 is formed to be oriented downward while bending near the central side in the cup 2 and to be oriented toward the exhaust ports 20 from the central side of the cup 2 on the bottom wall 35 of the cup 2. In addition, the second flow path 22 is formed to be oriented downward while bending near the outer-peripheral-side in the cup 2 and to be oriented toward the exhaust ports 20 from the outer-peripheral-side of the cup 2 on the bottom wall 35 of the cup 2. The first drainage ports 23 formed in the inner base wall 35A of the bottom wall 35 are located upstream of the horizontal surface 36E of the annular protrusion 36 in which the exhaust ports 20 are formed in the first flow path 21. The second drainage ports 24 formed in the outer base wall 35B of the bottom wall 35 are located upstream of the horizontal surface 36E in the second flow path 22.

Regarding the switching of drainage paths, in the state in which the annular body 4 is disposed at the upper position, the first flow path 21 is expanded and the second flow path 22 is narrowed, so that the first flow path 21 is used as an exhaust path. Hereinafter, the state in which the annular body 4 is disposed at the upper position will be referred to as an "upper disposition state", and the state in which the annular body 4 is disposed at the lower position will be referred to as a "lower disposition state". In the lower disposition state, the second flow path 22 is used as an exhaust path since the first flow path 21 is narrowed and the second flow path 22 is narrowed. The upper disposition state and the lower disposition state correspond to a first state and a second state in the claims, respectively.

In the upper disposition state, the upper inclined wall 42 of the annular body 4 enters the concave portion 37c of the upper wall 37 of the cup 2, and the narrowing inclined surface 37a forming the concave portion 37c and the outer peripheral surface of the upper inclined wall 42 approach each other and opposite each other. Due to such an approach and opposition, a relatively long portion of the second flow path 22 is narrowed, and a pressure loss in this portion becomes relatively large. Due to such a relatively-large pressure loss, an exhaust amount exhausted through the second flow path 22 becomes zero or very small. That is, the exhaust through the second flow path 22 is stopped.

On the other hand, no narrowed portion is formed in the first flow path 21 in the upper disposition state. More specifically, in the upper disposition state, the tip of the upper inclined wall 42 of the annular body 4 and the inclined surface 30A of the flange 30 of the cup 2, which narrow the first flow path 21 in the lower disposition state, as will be described later, are separated from each other at a relatively great level. Further, the narrowing projection 36F of the annular protrusion 36 of the cup 2 and the opposite inclined surface 40 of the annular body 4 are also separated from each other at a relatively great level. Then, the approach and opposition of the tip-side inclined portion 43b of the inner inclined wall 43 of the annular body 4 to the inner inclined wall 36C of the annular protrusion 36 are released. As described above, since the portion of the first flow path 21 that is narrowed in the lower disposition state is expanded in the upper disposition state, the first flow path 21 is exhausted.

In addition, in this upper disposition state, the portion where the second flow path 22 is narrowed is above the wafer W placed on the spin chuck 11. Since the cup 2 and the annular body 4 that perform this narrowing are close to each other but are not in contact with each other, the generation of particles in this narrowed portion and the adhesion of particles to a device forming surface, which is the upper surface of the wafer W, are prevented.

In the lower disposition state, the tip of the upper inclined wall 42 of the annular body 4 and the inclined surface 30A of the flange 30 are in contact with each other, the narrowing projection 36F of the annular protrusion 36 and the opposite inclined surface 40 of the annular body 4 approach each other. Further, the tip-side inclined portion 43b of the inner inclined wall 43 of the annular body 4 and the inner inclined wall 36C of the annular protrusion 36 approach each other and opposite each other. That is, a pressure loss increases in a gap between the tip of the upper inclined wall 42 and the inclined surface 30A (referred to as an "upstream gap"), a gap between the narrowing projection 36F and the opposite inclined surface 40 of the annular body 4 (referred to as a "downstream gap"), and a gap between the tip-side inclined portion 43b and the inner inclined wall 36C (referred to as a "midstream gap").

In addition, in order to suppress the generation of particles, the tip of the upper inclined wall 42 is not pressed against or brought into close contact with the inclined surface 30A of the flange 30. Therefore, a very small gap, which is described as the upstream gap, is formed between the tip of the upper inclined wall 42 and the inclined surface 30A. In this way, since each portion of the first flow path 21 is in the state of being narrowed and the pressure loss is relatively large in each of the upstream gap, the midstream gap, and the downstream gap, which are the portions narrowed as described above, the exhaust amount through the first flow path 21 becomes zero or very small. That is, the exhaust through the first flow path 21 is stopped.

On the other hand, no narrowed portion is formed in the second flow path 22 in the lower disposition state. More specifically, regarding the concave portion 37c of the upper wall 37 of the cup 2 and the upper inclined wall 42, which narrow the second flow path 22 in the upper disposition state, in the lower disposition state, the upper inclined wall 42 is located below the concave portion 37c rather than entering the concave portion 37c of the upper wall 37 of the cup 2, and the narrowing inclined surface 37a forming the concave portion 37c and the upper inclined wall 42 are separated from each other at a relatively great level. As described above, since the portion of the second flow path 22 that is narrowed in the upper disposition state is expanded in the lower disposition state, the second flow path 22 is exhausted.

In the lower disposition state, since the tip of the upper inclined wall 42 and the inclined surface 30A of the flange 30 are in contact with each other and the above-described upstream gap is minute, the liquid dropped from the wafer W is suppressed from flowing through the first flow path 21 and flowing into the first drainage ports 23 via the upstream gap. Since the portion where the upper inclined wall 42 and the flange 30 are in contact with each other is below the wafer W on the spin chuck 11, even if particles are generated, the particles are prevented from adhering to the upper surface of the wafer W.

In the above-described first flow path 21 and second flow path 22, depending on the width, length, bending, and the like of each portion, a total pressure loss of the exhaust paths (the first flow path 21 and the second flow path 22) in the cup 2 in the upper disposition state and a total pressure loss of the exhaust paths in the cup 2 in the lower disposition state are made equal or substantially equal to each other. For this reason, an exhaust performance of the cup 2 during processing with the positive developer D1 and an exhaust performance of the cup 2 during processing with the negative developer D2 are made equal to each other, so that mist can be prevented from flowing out of the cup 2 during either processing.

In order to more clearly describe the advantages of formation of the flow paths based on respective shapes of the annular protrusion 36 of the cup 2 and the lower end portion of the annular body 4 as described above, a comparative example will be given below. It is assumed that the tip-side inclined portion 43b of the inner inclined wall 43 of the annular body 4 is a vertical wall X extending vertically downward, the outer inclined wall 44 is a vertical wall Y extending vertically downward, and the inner inclined wall 36C and the outer inclined wall 36D of the annular protrusion 36 of the bottom wall 35 are vertical walls, and the vertical walls form vertical surfaces $\alpha$ and $\beta$ facing the central side and the outer-peripheral-side, respectively. The vertical wall X is located closer to the center of the cup 2 than the vertical surface $\alpha$, and the vertical wall Y is located closer to the outer-peripheral-side of the cup 2 than the vertical surface $\beta$. That is, a configuration in which respective portions described as inclined walls are formed to constitute vertical walls without being changed in the disposition order in the radial direction of the cup is taken as a comparative example (Comparative Example 1), and the configuration described so far is taken as Example.

In Comparative Example 1, in the upper disposition state, since the lower end of the vertical wall X of the annular body 4 is located above the vertical plane a of the annular protrusion 36, the first flow path 21 is in the expanded state. In the low disposition state, since the vertical wall X and the vertical surface α approach each other and opposite each other, the first flow path 21 is narrowed. On the other hand, since the vertical wall Y of the annular body 4 and the vertical surface β of the annular protrusion 36 opposite each other while being spaced apart from each other at a relatively large distance, the second flow path 22 is not narrowed.

However, in such a configuration, if a manufacturing error occurs with respect to the vertical wall X and/or the vertical surface α, there is a concern that it may be difficult to cancel the influence of the error on a dimension of the gap between the vertical wall X and the vertical surface α. Specifically, it is conceivable that as the gap dimension becomes smaller than a design value, the vertical wall X may come into contact with the vertical surface α when the annular body 4 moves to the lower position. In addition, it is conceivable that the first flow path 21 is not sufficiently narrowed as the gap dimension becomes larger than the design value. When these matters occur, components of the cup 2 including, for example, the annular body 4 or the vertical wall X, may need to be remanufactured. Since the gap between the vertical wall Y and the vertical surface β is larger than the gap between the vertical wall X and the vertical surface α, there is a little concern that the vertical wall Y and the vertical surface β will come into contact with each other due to a manufacturing error of the vertical wall Y and/or the vertical surface β, but there is a concern that the conductance of the second flow path 22 will deviate from a proper range.

However, as in Example, the inner inclined wall 36C and the outer inclined wall 36D are formed in the annular protrusion 36, and flow paths are formed between the inner inclined wall 36C and the tip-side inclined portion 43b of the inner inclined wall 43 of the annular body 4, and between the outer inclined wall 36D and the outer inclined wall 44 of the annular body 4, respectively. That is, each side surface of the annular protrusion 36 and each wall at the lower end portion of the annular body 4 is inclined with respect to the directions in which the annular body 4 raises and lowers. As a result, by adjusting the height of the annular body 4, the width of the flow path formed by each side surface of the annular protrusion 36 and each wall of the annular body 4 can be adjusted.

Therefore, when narrowing the first flow path 21, interference between the tip-side inclined portion 43b and the inner inclined surface 35C of the annular protrusion 36 is prevented, which makes it possible to easily keep the conductance of the second flow path 22 within an appropriate range. That is, with the configuration of Example, the allowable range of manufacturing errors may be widened.

In the above, the first flow path 21 has been described to be narrowed when the tip-side inclined portion 43b of the annular body 4 and the inner inclined wall 36C of the annular protrusion 36 approach each other and opposite each other. The width of the midstream gap formed by the tip-side inclined portion 43b and the inner inclined wall 36C is relatively small and contributes to such narrowing. However, the width of the downstream gap formed by the narrowing projection 36F and the opposite inclined surface 40 of the base-end-side inclined portion 43a of the annular body 4 is relatively smaller, and the width of the upstream gap formed by the upper inclined wall 42 of the annular body 4 and the inclined surface 30A of the flange 30 of the cup 2 is zero or substantially zero. Therefore, the narrowing projection 36F, the opposite inclined surface 40, the upper inclined wall 42 of the annular body 4, and the inclined surface 30A of the flange 30 contribute more to stopping the exhaust through the first flow path 21.

In addition, since the annular protrusion 36 is provided with the inner inclined wall 36C and the outer inclined wall 36D, and the annular body 4 is provided with the inner inclined wall 43 and the outer inclined wall 44, the processing liquid can be guided to the first drainage port 23 and the second drainage port 24 along such inclined walls, which makes it possible to more reliably prevent the processing liquid from remaining in the cup 2.

In addition, when performing the narrowing of the first flow path 21 as described above, the formation of the opposite inclined surface 40 on the annular body 4 is a configuration that is effective for narrowing the gap in the first flow path 21 to more reliably prevent the exhaust through the first flow path 21 and obtaining a sufficient conductance of the second flow path 22 without being affected by the narrowing. This suppresses the negative developer D2 from flowing into the first drainage port 23 by the exhaust through the first flow path 21 during the processing with the negative developer D2, which contributes to separating the developer D1 and the negative developer D2 from each other and removing the same in a more reliable manner.

Returning back to FIG. 1, the developing apparatus 1 includes a controller 10. The controller 10 is configured with a computer and has a program. The program incorporates a group of steps so that a series of processes, which will be described later, can be executed by the developing apparatus 1. Based on the program, the controller 10 outputs a control signal to each part of the developing apparatus 1 so as to control an operation of each part. Specifically, various operations, such as the number of rotations of the spin chuck 11 by the rotary mechanism 13, the raising and lowering of the pins 14 by the lifting mechanism 15, the supply of the processing liquid from each supply mechanism to each nozzle 84, the movement of the nozzle 84 by each moving mechanism 82, the raising and lowering of the annular body 4 by the lifting mechanism 50, and the like are controlled by the above-mentioned control signal. The above-mentioned program is stored in a storage medium such as a compact disk, a hard disk, or a DVD and is installed in the controller 10.

Next, the processing of the wafer W in the developing apparatus 1 will be sequentially described. First, when the wafer W on which a positive resist film is formed is transferred onto the spin chuck 11 by the transfer mechanism, the wafer W is placed on the spin chuck 11 through the pins 14, attracted to and held by the spin chuck 11. Assuming that the annular body 4 is positioned at the lower position at this time, the annular body 4 moves to the upper position, and while the second flow path 22 is narrowed, the first flow path 21 is expanded. As a result, a state in which the gas outside the cup 2 passes through the second flow path 22 and flows into the exhaust port 20 is switched to a state in which the gas passes through the first flow path 21 and flows into the exhaust port 20.

The positive-developer nozzle 84A moves from the standby region 86A onto the wafer W, and the wafer W rotates. Then, the positive-developer nozzle 84A moves toward above the central portion of the wafer W along the radial direction of the wafer W while ejecting the positive developer D1 from above the peripheral edge of the wafer W, the positive developer D1 is supplied to the entire surface of the wafer W, and development processing is performed. The positive developer D1 dropped from the upper surface of the wafer W during this development processing flows downward along the inclined surface 30A of the flange 30, as illustrated in FIG. 4.

As such, in the first flow path 21, the positive developer D1 flowing along the inclined surface 30A of the flange 30 flows onto the inner base wall 35A of the bottom wall 35, which is the bottom of the first flow path 21, flows downward along the inner base wall 35A and flows into the first drainage port 23. In this way, the positive developer D1 is removed from the interior of the cup 2 by flowing through the first flow path 21 and into the first drainage port 23. In addition, mist generated by spattering the positive developer D1 from the wafer W or the cup 2 flows into the exhaust port 20 along with the exhaust flow of the gas flowing through the first flow path 21 and is removed from the interior of the cup 2.

Thereafter, while the ejection of the positive developer D1 from the positive-developer nozzle 84A stops and the positive-developer nozzle 84A returns to the standby region 86A, the cleaning-liquid nozzle 84C moves onto the central portion of the wafer W from the standby region 86C to eject a cleaning liquid onto the center of the rotating wafer W so that the positive developer D1 is washed away from the wafer W and removed. The positive developer D1 and the cleaning liquid are also removed by flowing through the first flow path 21 to the first drainage port 23, and the mist is removed from the interior of the cup 2 by flowing into the exhaust port 20. Thereafter, while the ejection of the cleaning liquid from the cleaning-liquid nozzle 84C is stopped and the cleaning-liquid nozzle 84C returns to the standby region 86C, the wafer W continues to rotate so that the cleaning liquid is shaken off from the wafer W and the wafer W is dried. Thereafter, the rotation of the wafer W is stopped, and the wafer W is delivered to the transfer mechanism via the pins 14 and is unloaded from the developing apparatus 1.

Next, it is assumed that a wafer W on which a negative resist film is formed is transferred onto the spin chuck 11 by the transfer mechanism. The annular body 4 moves to the lower position, and while the second flow path 22 is expanded, the first flow path 21 is narrowed. As a result, the state in which the gas outside the cup 2 passes through the first flow path 21 and flows into the exhaust port 20 is switched to the state in which the gas passes through the second flow path 22 and flows into the exhaust port 20.

The development processing is performed in the same manner as when the positive developer D1 is supplied, except that the negative developer D2 is ejected from the negative-developer nozzle 84B. As illustrated in FIG. 5, the negative developer D2 dropped from the wafer W during the development processing flows downward along the inclined surface 30A of the flange 30 and flows along the outer peripheral surface of the upper inclined wall 42 of the annular body 4. At this time, since the inclined surface 30A and the tip of the upper inclined wall 42 of the annular body 4 are in contact with each other, the negative developer D2 is suppressed from flowing into the first flow path 21.

Thereafter, the negative developer D2 flows downward along the outer surfaces of the vertical wall 41 and the outer inclined wall 44 of the annular body 4, is dropped onto the outer base wall 35B of the bottom wall 35, which is the bottom of the second flow path 22, and flows downward along the outer base wall 35B to be flown into the second drainage port 24. In this way, the negative developer D2 is removed from the interior of the cup 2 by flowing through the second flow path 22 and into the second drainage port 24. In addition, the mist generated by spattering the negative developer D2 from the wafer W or the cup 2 flows into the exhaust port 20 along with the exhaust flow of the gas flowing through the second flow path 22 and is removed from the interior of the cup 2.

After the ejection of the negative developer D2 is completed, the wafer W is cleaned by ejecting the cleaning liquid from the cleaning-liquid nozzle 84C in the same manner as when the positive developer D1 is processed. During this cleaning, the negative developer D2 and the cleaning liquid flow into the second drainage port 24 and are removed, and the mist is removed from the interior of the cup 2 by flowing into the exhaust port 20. After cleaning, the wafer W is dried by the above-described shaking-off with the cleaning liquid, and the dried wafer W is unloaded from the developing apparatus 1 by the transfer mechanism via the pins 14. Thereafter, when processing a wafer W on which a positive resist film is formed, the annular body 4 is moved again to the upper position, and processing is performed.

With the developing apparatus 1 according to the present disclosure, exhaust is performed by one of the first flow path 21 and the second flow path 22 by raising and lowering the annular body 4 inside the cup 2. The exhaust through the first flow path 21 and the exhaust through the second flow path 22 are performed by opening the exhaust port 20 common to the first flow path 21 and the second flow path 22 to be directed toward the central side and the outer-peripheral-side of the bottom wall 35 of the cup 2, respectively. The drainage is performed by the first drainage port 23 and the second drainage port 24 which open on the way to the exhaust port 20. With such a configuration, it is possible to prevent the cup 2 from becoming larger in the radial direction while enabling the liquids to be drained separately to each of the first drainage port 23 and the second drainage port 24. More specifically, it is assumed that an exhaust port dedicated to the first flow path 21 and an exhaust port dedicated to the second flow path 22 are provided, these exhaust ports are at different positions in the radial direction of the cup 2, and one to be used among the exhaust ports is switched depending on the raising and lowering of the annular body 4. Compared with such a configuration (taken as Comparative Example 2), the cup 2 can be made smaller, which makes it possible to reduce the developing apparatus 1 in size.

Further, the sidewall 34 of the cup 2 may be divided into upper and lower parts, the upper part of the sidewall 34 may be removed from the lower part of the sidewall 34 together with the upper wall 37, and the annular body 4 may be exposed to a space outside the cup 2 by such a removal. The annular body 4 thus exposed may be removed from the cup 2. More specifically, the annular body 4 may be removed from the structure including the lower part of the sidewall 34, the annular wall 33, the vertical wall 28 and the circular ring-shaped plate 25, and may be cleaned.

On the other hand, since the circular ring-shaped member 31 on which the sealing projection 31a is provided is provided on the circular ring-shaped plate 25 as a separate member from the annular body 4, the height of the sealing projection 31a is not changed by the removal of the annular body 4. From the role of the sealing projection 31a and the viewpoint of preventing contact with the wafer W, the height of the sealing projection 31a is adjusted with high accuracy. On the other hand, the annular body 4, which forms a flow path, is relatively susceptible to contamination, thus being subjected to cleaning processing at a relatively high frequency. Since the sealing projection 31a and the annular body 4 are separate bodies, an operator does not need to adjust the height of the sealing projection 31a every time the annular body 4 is cleaned, which makes it possible to reduce the frequency of height adjustment.

Here, the configuration of Comparative Example 2 described above is considered. Assuming that exhaust ports are provided at different positions in the radial direction. In order to prevent waste liquid from flowing into each of the exhaust ports, a covering member may be provided to cover the exhaust ports provided at the different positions, that is, the central side and the outer peripheral side. The covering member has an inclined upper surface. Thus, the covering member serves as a guide for causing the liquid to flow downward to the bottom of the cup. Under this circumstance, a length of the guide in the radial direction of the cup is relatively large. Therefore, in the radial direction, a position of the guide and a position where the sealing projection 31a is to be provided overlap each other so that the sealing projection 31a is provided on the guide. However, like the annular body 4, the guide is susceptible to contamination due to adhesion of the processing liquid. Thus, the guide needs to be cleaned, and the height of the sealing projection 31a needs to be adjusted each time the guide is cleaned. However, since the developing apparatus 1 includes the exhaust port common to the first flow path 21 and the second flow path 22, the size of the guide in the radial direction may be small. Specifically, the raised portion 29, the flange 30, and the annular body 4 correspond to the guide, the sealing projection 31a is provided as a member separate from these members, closer to the center of the cup 2 than the members. As described above, with the configuration of the developing apparatus 1, the frequency of adjusting the height of the sealing projection 31a can be reduced, which facilities the maintenance of the apparatus.

In the developing apparatus 1, the flow path to be used is switched by raising and lowering the annular body 4 with respect to the cup 2, but a configuration in which the flow path to be used is switched by raising and lowering the cup 2 with respect to the annular body 4 may be adopted. In addition, the positive developer D1 and the negative developer D2 are not limited to being discharged from the first drainage port 23 and the second drainage port 24 via the first flow path 21 and the second flow path 22 in combination as described above. For example, the positive developer D1 may be discharged from the second drainage port 24 via the second flow path 22 outside the annular body 4, and the negative developer D2 may be discharged from the first drainage port 23 via the first flow path 21 inside the annular body 4.

The processing liquids to be supplied to the wafer W are not limited to a developer or a cleaning liquid, and a coating liquid for forming a coating film, such as a resist, a chemical for forming an insulating film, a chemical for forming an antireflection film or the like, may be used, and an adhesive for bonding a plurality of wafers W may be used. Therefore, the liquid processing apparatus of the present technology is not limited to the developing apparatus 1. The substrate to be processed is not limited to the wafer W, and may be, for example, a rectangular substrate such as a substrate for manufacturing a flat panel display (FPD).

According to the present disclosure, it is possible to prevent a liquid processing apparatus, which is capable of switching an exhaust flow path inside a cup, from being increased in size.

It should be noted that the embodiments disclosed herein are exemplary in all respects and are not restrictive. The above-described embodiments may be omitted, replaced, modified, and combined in various forms without departing from the scope and spirit of the appended claims.

What is claimed is:

1. A liquid processing apparatus comprising:
   a stage on which a substrate is placed;
   a cup configured to surround the substrate placed on the stage;
   a nozzle configured to supply a processing liquid to the substrate to perform processing;
   an exhaust port provided in a bottom portion of the cup to exhaust an interior of the cup;
   an annular body provided inside the cup to surround the substrate in a plan view and configured to form a flow path for a gas flowing into the cup from an opening of the cup;
   a lifting mechanism configured to raise or lower the annular body relative to the cup to perform a switching between a first state in which the annular body is located at a first relative height and a first exhaust is performed through a first flow path that allows the gas to flow from a central side of the cup into the exhaust port and a second state in which the annular body is located at a second relative height and a second exhaust is performed through a second flow path that allows the gas to flow from an outer-peripheral-side of the cup into the exhaust port; and
   a first drainage port open to the first flow path and a second drainage port open to the second flow path,
   wherein a protrusion is formed on the bottom portion of the cup, and the exhaust port opens in a top portion of the protrusion,
   wherein the protrusion has a width that is reduced upward so that a side surface of the protrusion on the central side of the cup and a side surface of the protrusion on the outer-peripheral-side of the cup form a first inclined surface and a second inclined surface, respectively,
   wherein the first relative height is a position at which the annular body is located higher than the second relative height with respect to the cup,
   wherein the annular body has a first extension portion and a second extension portion which extend downward toward the central side and the outer-peripheral-side of the cup, respectively, and
   wherein the first inclined surface and the first extension portion form the first flow path, and the second inclined surface and the second extension portion form the second flow path.

2. The liquid processing apparatus of claim 1, wherein the annular body is located above the exhaust port.

3. The liquid processing apparatus of claim 2, wherein the switching between the first state and the second state is performed by raising or lowering the annular body relative to the cup to narrow one flow path of the first flow path and the second flow path and expand another flow path of the first flow path and the second flow path.

4. The liquid processing apparatus of claim 1, wherein the annular body has an opposite inclined surface, which faces the exhaust port and descends toward the central side of the cup, and
   the first flow path is narrowed and expanded by raising and lowering the opposite inclined surface relative to the protrusion.

5. The liquid processing apparatus of claim 3, wherein the cup includes a covering portion formed from a sidewall of the cup toward the central side of the cup so that the cup overlaps the annular body in a plan view, and wherein a concave portion is formed in a bottom surface of the covering portion, and in the first state, the annular body enters the concave portion to narrow the second flow path.

6. The liquid processing apparatus of claim 5, wherein the annular body includes a barrel portion having an outer peripheral surface that descends from the central side of the cup toward the outer-peripheral-side of the cup, and wherein the concave portion forms an opposite surface that faces the outer peripheral surface of the barrel portion to narrow the second flow path in the first state.

7. A liquid processing method comprising:

providing the liquid processing apparatus according to claim 1;

placing a substrate on the stage;

performing a processing by supplying a processing liquid to the substrate from the nozzle;

exhausting the interior of the cup from the exhaust port provided in the bottom portion of the cup setting the first state in which the annular body is located at the first relative height and a first exhaust is performed through the first flow path that allows gas to flow from the central side of the cup into the exhaust port;

setting the second state in which the annular body is located at the second relative height and a second exhaust is performed through the second flow path that allows the gas to flow from the outer-peripheral-side of the cup into the exhaust port;

performing a switching between the first state and the second state by raising and lowering the annular body relative to the cup by the lifting mechanism; and performing a drainage from the first drainage port open to the first flow path and the second drainage port open to the second flow path.

* * * * *